(12) United States Patent
Li et al.

(10) Patent No.: US 11,737,340 B2
(45) Date of Patent: Aug. 22, 2023

(54) DISPLAY PANEL, MANUFACTURING METHOD THEREOF AND DISPLAY EQUIPMENT

(71) Applicants: MIANYANG BOE OPTOELECTRONICS TECHNOLOGY CO., Ltd., Mianyang (CN); BOE Technology Group Co., Ltd., Beijing (CN)

(72) Inventors: Dali Li, Beijing (CN); Zerui Zhang, Beijing (CN); Yong Hu, Beijing (CN)

(73) Assignees: MIANYANG BOE OPTOELECTRONICS TECHNOLOGY CO., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/352,312

(22) Filed: Jun. 20, 2021

(65) Prior Publication Data

US 2022/0165813 A1    May 26, 2022

(30) Foreign Application Priority Data

Nov. 25, 2020 (CN) .......................... 202011344354.X

(51) Int. Cl.
| | |
|---|---|
| *G06F 3/041* | (2006.01) |
| *H10K 59/65* | (2023.01) |
| *H10K 59/40* | (2023.01) |
| *H10K 59/12* | (2023.01) |

(52) U.S. Cl.
CPC .......... *H10K 59/65* (2023.02); *G06F 3/0412* (2013.01); *G06F 3/04164* (2019.05); *H10K 59/40* (2023.02); *G06F 2203/04103* (2013.01); *H10K 59/1201* (2023.02)

(58) Field of Classification Search
None
See application file for complete search history.

(56) References Cited

U.S. PATENT DOCUMENTS

2021/0397320 A1* 12/2021 Ye .......................... G06F 3/0448

* cited by examiner

*Primary Examiner* — Brian M Butcher
(74) *Attorney, Agent, or Firm* — IPro, PLLC

(57) ABSTRACT

Disclosed are a display panel, a manufacturing method thereof and display equipment. The display panel comprises a display area, the display area comprises a camera area and a peripheral area surrounding the camera area, the camera area is provided with a transparent first touch control structure, and the first touch control structure is arranged between a substrate and an organic luminescent layer.

8 Claims, 4 Drawing Sheets

DISPLAY PANEL, MANUFACTURING METHOD THEREOF AND DISPLAY EQUIPMENT

CROSS REFERENCE TO RELEVANT APPLICATIONS

The application claims priority to Chinese Patent Application No. 202011344354.X filed in the China National Intellectual Property Administration on Nov. 25, 2020, and the title of "Display Panel, Manufacturing Method thereof and Display Equipment", the contents of which are incorporated herein by reference in its entirety.

TECHNICAL FIELD

The disclosure relates to the technical field of display, in particular to a display panel, a manufacturing method thereof and display equipment.

BACKGROUND

The development of display technology has led to the emergence of a display panel with an under-display camera, which can expand the display area of display equipment and improve the display effect of display equipment. Besides, compared with display equipment provided with a telescopic camera, the display panel with the under-display camera can improve the overall airtightness of the display equipment. Therefore, display panels with under-display cameras have been increasingly applied.

SUMMARY

The disclosure provides a display panel, a manufacturing method thereof and display equipment.

In a first aspect, an embodiment of the disclosure provides a display panel comprising a display area, the display area comprises a camera area and a peripheral area surrounding the camera area; and the camera area is provided with a transparent first touch control structure, and the first touch control structure is arranged between a substrate and an organic luminescent layer.

In a second aspect, an embodiment of the disclosure provides a manufacturing method of a display panel, comprising:

preparing an initial structure of a first touch control structure on one side of a substrate;

treating the initial structure of the first touch control structure by annealing to obtain the first touch control structure; and preparing an organic luminescent layer on the side, away from the substrate, of the first touch control structure.

In a third aspect, an embodiment of the disclosure provides display equipment comprising the display panel as provided in the first aspect.

Additional aspects and advantages of the disclosure will be set forth in the following description, and these will become apparent from the following description, or may be learned by practice of the disclosure.

The above description is only an overview of the technical solution of this disclosure, which can be implemented according to the contents of the specification in order to understand the technical means of this disclosure more clearly, and in order to make the above and other objects, features and advantages of this disclosure more obvious and understandable, the detailed description of this disclosure will be given below.

BRIEF DESCRIPTION OF THE DRAWINGS

In order to explain the technical solution in the embodiments of the disclosure or related arts more clearly, the drawings used in the description of the embodiments or related arts will be briefly introduced below. Obviously, the drawings in the following description are only some embodiments of the disclosure, and for those of ordinary skill in the art, other drawings can be obtained according to these drawings without paying creative labor.

The above and/or additional aspects and advantages of the disclosure will become apparent and easily understood from the following description of embodiments taken in conjunction with the accompanying drawings, in which.

DETAILED DESCRIPTION

Figure 1:
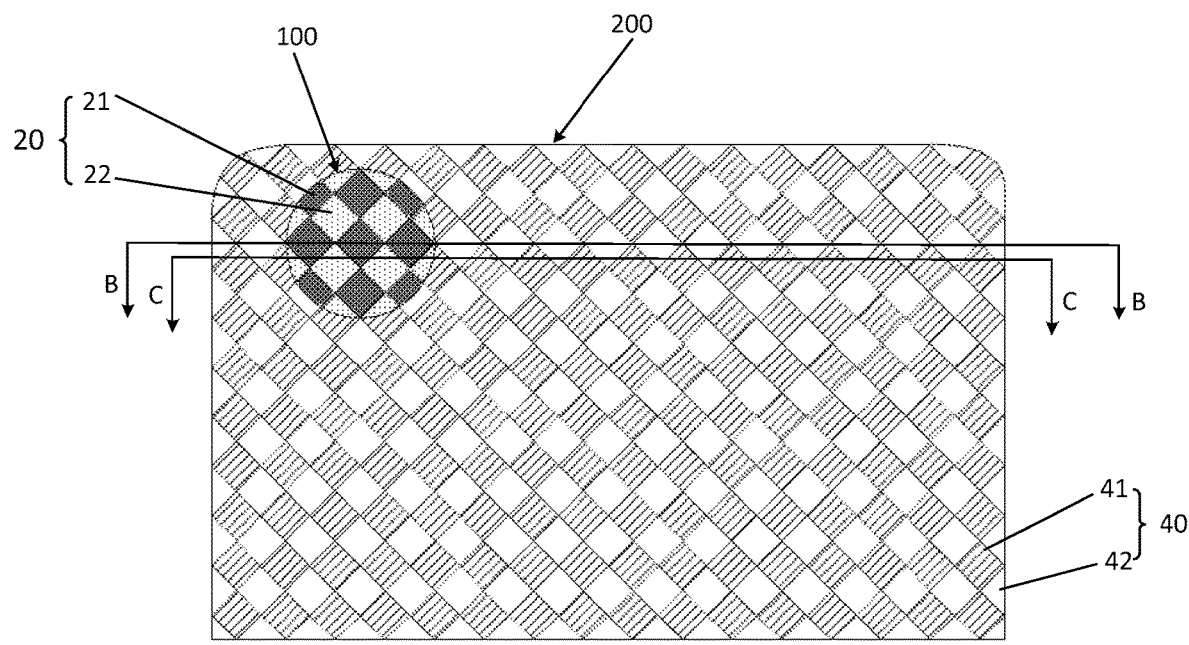
FIG. 1 is a structural diagram of a display panel provided by an embodiment of the disclosure.

Hereinafter, the disclosure will be described in detail, and examples of embodiments of the disclosure are shown in the accompanying drawings, in which the same or similar reference numerals refer to the same or similar components or components having the same or similar functions throughout. In addition, if the detailed description of a known technology is unnecessary to show the features of the disclosure, it is omitted. The embodiments described below by referring to the drawings are exemplary, and are only used to explain the disclosure, and cannot be interpreted as limiting the disclosure.

It can be understood by those skilled in the art that unless otherwise defined, all terms (including technical terms and scientific terms) used herein have the same meanings as those generally understood by those skilled in the art to which this disclosure belongs. It should also be understood that terms such as those defined in a general dictionary should be understood to have meanings consistent with those in the context of related arts, and will not be interpreted in idealized or overly formal meanings unless specifically defined as here.

As will be understood by those skilled in the art, the singular forms "a", "an", "said" and "the" used herein may also include plural forms unless expressly stated. It should be further understood that the word "comprise" used in the specification of this disclosure means the presence of stated features, integers, steps, operations, elements and/or components, but does not exclude the presence or addition of one or more other features, integers, steps, operations, elements, components and/or groups thereof. It should be understood that when we say that an element is "connected" to another element, it may be directly connected to the other element, or there may be intermediate elements. In addition, "connect" or "couple" as used herein may include wireless connection or wireless coupling. As used herein, the phrase "and/or" includes all or any unit and all combinations of one or more associated listed items.

The inventor of the disclosure found through research that, in current display panels with under-display cameras, for example, in an active-matrix organic light-emitting diode (AMOLED) display panel, in order not to affect the display and image pickup of a camera area corresponding to an under-display camera, there is no wire arrangement for a flexible multi-layer on cell (FMLOC) touch control structure in the camera area. Most relevant AMOLED display panels are capacitive touch display panels, that is, man-machine signal interaction is realized through the change of capacitance at a touch position. If there is no metal wire in the camera area, it means that there is no capacitance, that is, the camera area of the display panel has no touch control function, which will affect the user experience.

Traditional metal wires are usually of a Ti (titanium)/Al (aluminum)/Ti structure. Because Ti and Al are opaque, the metal wires of the Ti/Al/Ti structure are also opaque. If the metal wires of this structure are placed in the camera area of the display panel, the normal display of pictures and the image pickup function of the camera area will be affected. In the industry of semiconductor display, indium tin oxide (ITO) is usually adopted as the wire in the camera area of the display panel in order to ensure the conductivity and light transmittance of a conductor. However, due to the limitation of materials, an organic luminescent layer in the display panel cannot withstand high temperature. Generally speaking, the highest temperature that a material for making the organic luminescent layer can withstand is 85° C., so the ITO wire in the camera area can only be made by a film-forming process below 85° C., but the conductivity of ITO formed at this temperature is too poor, which will seriously affect users' touch control experience.

The display panel, the manufacturing method thereof and the display equipment provided by the disclosure aim to solve the above technical problems of related arts.

The technical solution of this disclosure and how to solve the above technical problems with the technical solution of this disclosure will be described in detail below with specific embodiments.

Figure 2:
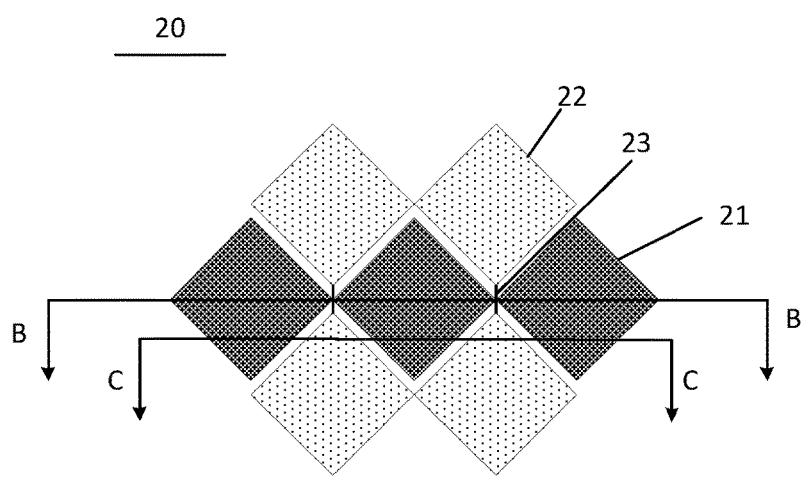
FIG. 2 is a structural diagram of a first touch control structure of the display panel in FIG. 1 provided by an embodiment of the disclosure.
Figure 3:
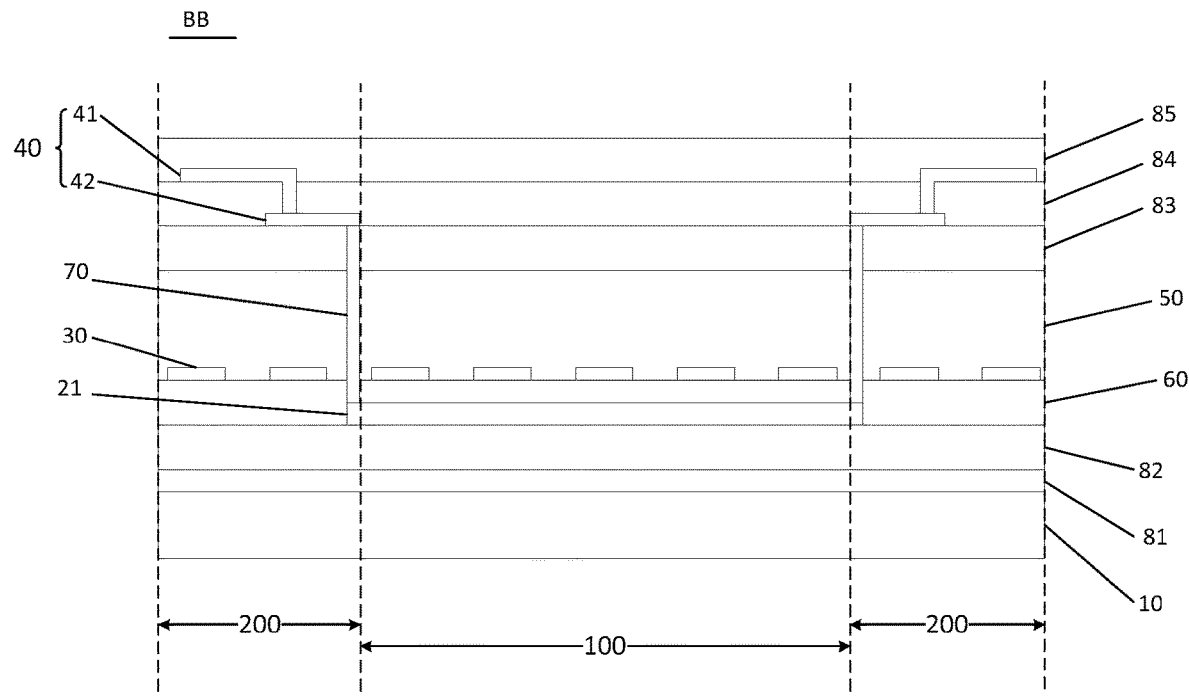
FIG. 3 is a cross-sectional view along the BB direction of the display panel in FIG. 1 provided by an embodiment of the present disclosure.
Figure 4:
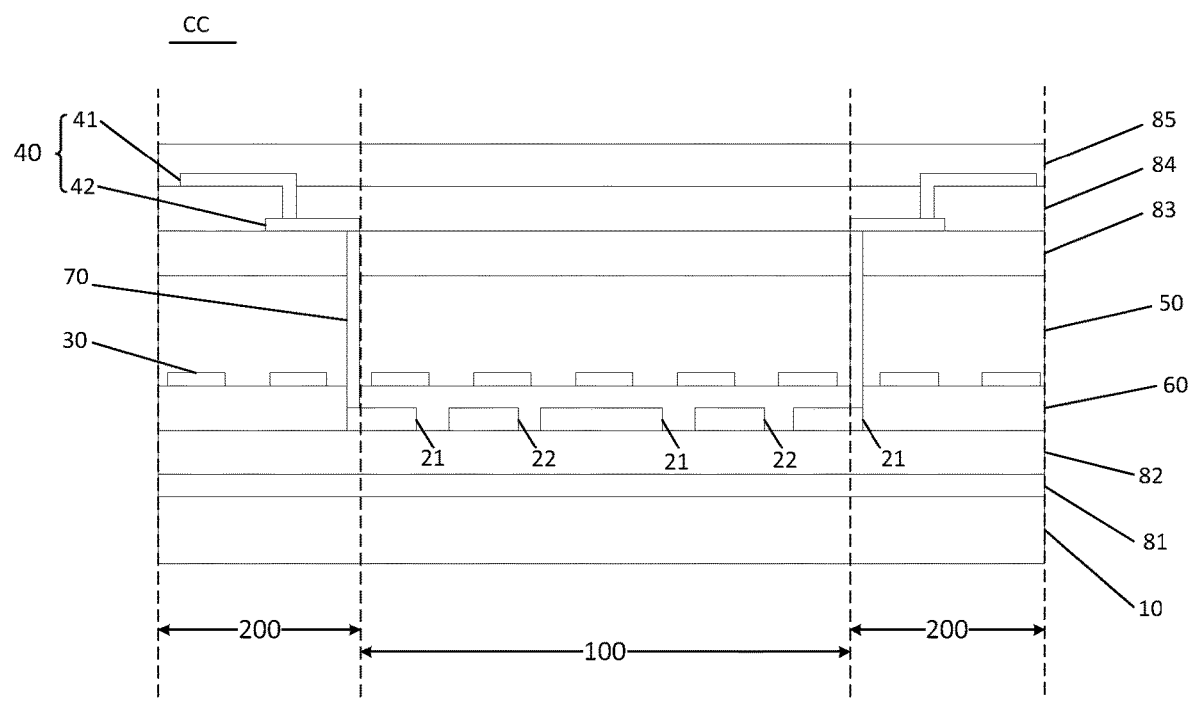
FIG. 4 is a cross-sectional view along the CC direction of the display panel in FIG. 1 provided by an embodiment of the present disclosure.

An embodiment of the disclosure provides a display panel. FIG. 1 is a structural diagram of the display panel provided by the embodiment of the disclosure. FIG. 2 is a structural diagram of a first touch control structure of the display panel in FIG. 1 provided by the embodiment of the disclosure. FIG. 3 is a cross-sectional view along the BB direction of the display panel in FIG. 1 provided by the embodiment of the present disclosure. FIG. 4 is a cross-sectional view along the CC direction of the display panel in FIG. 1 provided by the embodiment of the present disclosure. The display panel comprises a display area, the display area comprises a camera area 100 and a peripheral area 200 surrounding the camera area 100, the camera area 100 is provided with a transparent first touch control structure 20, and the first touch control structure is arranged between a substrate 10 and an organic luminescent layer 30.

In the display panel provided by the embodiment of the disclosure, since the transparent first touch control structure 20 is provided in the camera area 100 of the display area, the camera area 100 of the display panel has a touch control function. Further, the first touch control structure 20 is located between the substrate 10 and the organic luminescent layer 30, that is, the preparation of the first touch control structure 20 takes place before the preparation of the organic luminescent layer 30, thus effectively avoiding the influence of a process for preparing the first touch control structure 20 on the organic luminescent layer 30 while ensuring the conductivity of the first touch control structure 20, so that the camera area 100 of the display panel provided by the embodiment of the disclosure can realize the display and touch control functions, and the light transmittance of the camera area 100 and the image pickup effect of the camera area 100 are guaranteed.

Specifically, in the embodiment of the disclosure, the camera area 100 for light to pass through is arranged in the display area of the display panel to enable normal imaging of an imaging module, the transparent first touch control structure 20 is arranged in the camera area 100, and the first touch control structure 20 is located between the substrate 10 and the organic luminescent layer 30, allowing the preparation of the first touch control structure 20 in the display panel to take place before the preparation of the organic luminescent layer 30, thus avoiding the influence of a high temperature annealing process for preparing the first touch control structure 10 on the organic luminescent layer 30 while ensuring the conductivity of the first touch control structure 20, so that the camera area 100 of the display panel can realize the display and touch control functions, and the light transmittance of the camera area 100 and the image pickup effect of the camera area 100 are guaranteed.

Meanwhile, in the embodiment of the disclosure, the first touch control structure 20 is made of ITO, and because ITO has a high light transmittance, the whole first touch control structure 20 made of ITO is transparent. Since the first touch control structure 20 is transparent, the area of the first touch control structure 20 in the camera area 100 can be expanded as much as possible, which is beneficial to reducing the overall resistance of the first touch control structure 20, thereby ensuring the sensitivity of the touch control function of the camera area 100 and ensuring the overall touch control experience that the display panel can provide.

In the embodiment of the disclosure, the substrate 10 is made of polyimide (PI).

In one embodiment of the disclosure, the peripheral area 200 is provided with a second touch control structure 40, and the second touch control structure 40 is located on the side, away from the organic luminescent layer 30, of a thin film encapsulation layer 50 and is electrically connected with the first touch control structure 20.

In the embodiment of the disclosure, the second touch control structure 40 is arranged in the peripheral area 200 of the display area of the display panel. Since the peripheral area 200 of the display panel is not used for allowing external light to pass through, the second touch control structure 40 arranged in the peripheral area 200 can adopt a metal wire of a Ti/Al/Ti structure. Further, the second touch control structure 40 is arranged on the side, away from the organic luminescent layer 30, of the thin film encapsulation layer 50 and electrically connected with the first touch control structure 20. In the embodiment of the disclosure, the thin film encapsulation layer 50 is of a thin film encapsulation (TFE) structure, and specifically comprises two inorganic films and an organic film sandwiched between the two inorganic films.

In the embodiment of the disclosure, as shown in FIG. 1, the second touch control structure 40 is an FMLOC touch control structure, comprising first touch wires 41 and second touch wires 42. It should be noted that in FIG. 1, in order to understand the structure of the second touch control structure 40, two kinds of rhombic blocks in the peripheral area 200 represent the first touch wires 41 and the second touch wires 42 respectively. In an actual display panel structure, in order to prevent the first touch wires 41 and the second touch wires 42 from blocking the light emitted from the organic luminescent layer 30 and ensure the display effect of the peripheral area 200 of the display panel, in the direction perpendicular to the substrate 10, the first touch wires 41 and the second touch wires 42 are arranged along the areas between R (red), G (green) and B (blue) sub-pixels in the organic luminescent layer 30. The areas where the two rhombic blocks in the peripheral area 200 are located in FIG. 1 actually correspond to the positions where the R (red), G (green) and B (blue) sub-pixels are located, specifically, one rhombic block can contain multiple sub-pixels or only one sub-pixel. The first touch wires 41 and the second touch wires 42 are arranged along the areas between the sub-pixels, thereby forming a grid-like FMLOC touch control structure.

It should be noted that, as shown in FIG. 1, the first touch wires 41 and the second touch wires 42 located at an edge of the peripheral area 200 of the display panel are incomplete, and a touch control signal in this area is weaker than that in the areas where the complete first touch wires 41 and second touch wires 42 are located. By arranging a processing device to adjust the signal in this area, the touch control signal in this area can be enhanced, thus ensuring the integrity of the touch control function of the display panel.

In one embodiment of the disclosure, the first touch control structure 20 comprises a plurality of first wires 21 and a plurality of second wires 22, and the first wires 21 and the second wires 22 are insulated from each other. The first wires 21 are electrically connected with the second touch control structure 40, or the second wires 22 are electrically connected with the second touch control structure 40.

In the embodiment of the disclosure, as shown in FIG. 2 which is a structural diagram of the first touch control structure 20, the first wires 21 and the second wires 22 are insulated from each other, and in order to achieve the consistency and unification of the whole touch control function of the display panel, the first wires 21 or the second wires 22 of the first touch control structure 20 are electrically connected with the second touch control structure 40.

It should be noted that transmitting electrodes of the first touch control structure 20 are electrically connected with transmitting electrodes of the second touch control structure 40, or receiving electrodes of the first touch control structure 20 are electrically connected with receiving electrodes of the second touch control structure 40. For example, when the first wires 21 are the transmitting electrodes of the first touch control structure 20 and the first touch wires 41 are the transmitting electrodes of the second touch control structure 40, the first wires 21 are electrically connected with the first touch wires 41.

In one embodiment of the disclosure, the first wire 21 and the second wire 22 each comprise a plurality of electrode blocks, and in the direction parallel to the substrate 10, the shapes of the electrode blocks include at least one of the following: square and rhombus.

In the embodiment of the disclosure, in the first touch control structure shown in FIG. 2, the first wire 21 comprises a plurality of rhombic electrode blocks connected in sequence, and the second wire 22 comprises a plurality of rhombic electrode blocks connected in sequence. Compared with the grid-like second touch control structure 40 in the peripheral area 200 of the display panel, the first touch control structure 20 of the camera area 100 is made of the transparent ITO material, so the first wires 21 and the second wires 22 are arranged to comprise a plurality of square or rhombic electrode blocks, which is beneficial to reducing the overall resistance of the first touch control structure 20 while increasing the ratio of the area of the electrode blocks to the camera area 100, and as a result, the resistance difference between the first wires 21 or the second wires 22 in the first touch control structure 20 and the second touch control structure 40 is reduced, thereby ensuring the sensitivity of the touch control function of the camera area 100 and ensuring the overall touch control experience that the display panel can provide.

In one embodiment of the disclosure, the first wire 21 comprises a bridging wire 23, one end of the bridging wire 23 is connected with one electrode block of the first wire 21, and the other end of the bridging wire 23 is connected with another electrode block of the adjacent first wire 21. The electrode blocks of the first wires 21 and the electrode blocks of the second wires 22 are arranged on the same layer.

One of the development trends of related display panels is becoming thinner and thinner. In the embodiment of this disclosure, the electrode blocks of the first wires 21 and the electrode blocks of the second wires 22 are arranged on the same layer, which is beneficial to the thinning of the display panel. However, the problem of the electrode blocks of the first wires 21 and the electrode blocks of the second wires 22 being on the same layer is how to realize the electrical connection between the electrode blocks of the plurality of first wires 21 or the electrical connection between the electrode blocks of the plurality of second wires 22.

Therefore, it is necessary to connect two adjacent electrode blocks in the same first wire 21 with the bridging wire 23, or connect two adjacent electrode blocks in the same second wire 22 with the bridging wire 23. In the first touch control structure 20 shown in FIG. 2, the plurality of rhombic electrode blocks in the first wire 21 are connected in sequence, and for the two second wires 22, two adjacent rhombic electrode blocks in each second wire 22 are connected by the bridging wire 23.

Specifically, one end of the bridging wire 23 is connected with one electrode block of the second wire 22, and the other end of the bridging wire 23 is connected with another electrode block of the adjacent second wire 22. By providing the bridging wires 23, the electrode blocks of the same first wire 21 can be electrically connected, or the electrode blocks of the same second wire 22 can be electrically connected while ensuring that the electrode blocks of the first wires 21 and the electrode blocks of the second wires 22 are arranged on the same layer. Therefore, the working stability of the first wires 21 and the second wires 22 of the first touch control structure 20 is ensured.

It should be noted that, as shown in FIG. 1, the electrode blocks of the first wires 21 and the second wires 22 located at an edge of the camera area 100 of the display panel are incomplete, so a touch control signal in this area is weak. Similarly, the signal in this area can be adjusted by the processing device, so as to enhance the touch control signal in this area, thus ensuring the integrity of the touch control function of the display panel.

In one embodiment of the disclosure, a pixel defining structure 60 is disposed between the organic luminescent layer 30 and the first touch control structure 20, and the pixel defining structure 60 covers the first wires 21 and the second wires 22. In the direction parallel to the substrate 10, the pixel defining structure 60 is at least partially filled between the first wires 21 and the second wires 22.

In the embodiment of the disclosure, the pixel defining structure 60 covers the first wires 21 and the second wires 22 as a whole, so as to protect the first wires 21 and the second wires 22. Meanwhile, the pixel defining structure 60 is at least partially filled between the first wires 21 and the second wires 22, and part of the pixel defining structure 60 is used as a dielectric layer located at the first wires 21 and the second wires 22 in the first touch control structure 20, thus simplifying the structure and production process of the display panel, which is beneficial to improving the production efficiency of the display panel, and also avoids the separate preparation of the dielectric layer using other materials, thus reducing the production cost of the display panel. In the embodiment of the disclosure, the pixel defining structure 60 is a pixel design layer (PDL) structure in related display arts.

In one embodiment of the disclosure, as shown in FIGS. 3 and 4, the display panel further comprises jumper wires 70, one end of the jumper wire 70 is electrically connected with the second touch control structure 40, and the other end of the jumper wire 70 is electrically connected with the first wires 21 or the second wires 22. Specifically, in the embodiment of the disclosure, one end of the jumper wire 70 is electrically connected with the second touch wire 42 of the second touch control structure 40, and the other end of the jumper wire 70 is electrically connected with the first wire 21 of the first touch control structure 20.

It should be noted that in the embodiment of the disclosure, the jumper wire 70 is made of an opaque metal material. In order to ensure the display effect and image pickup effect of the camera area 100 of the display panel, the jumper wire 70 is arranged on the side, close to the camera area 100, of the peripheral area 200. In order to ensure the stability of connection between the first touch control structure 20 and the jumper wire 70 and increase the contact area between the first touch control structure 20 and the jumper wire 70, the first touch control structure 20 can also partially extend to the peripheral area 200 along the direction from the camera area 100 to the peripheral area 200, so that the first touch structure 20 can be electrically connected with the jumper wire 70.

In one embodiment of the disclosure, a planarization layer 82 is disposed between the substrate 10 and the organic luminescent layer 30 of the display panel, and the first touch control structure 20 is located on the side, away from the substrate 10, of the planarization layer 82.

In the embodiment of the disclosure, the first touch control structure 20 is disposed on the side, away from the substrate 10, of the planarization layer 82, which is because the planarization layer 82 has a high flatness and can provide a good substrate for the formation of an ITO film in the first touch control structure 20. It is understood by those skilled in the art that the first touch control structure 20 may be disposed on one side of any film between the substrate 10 and the organic luminescent layer 30.

In the embodiment of the disclosure, as shown in FIGS. 3 and 4, the display panel further comprises a display device film layer 81, an isolating layer 83, an insulating layer 84 and a covering layer 85. Specifically, in the embodiment of the disclosure, the planarization layer 82 is an insulating film structure after being subjected to the planarization (PLN) process in related display arts. The isolating layer 83 is a barrier layer in related display arts. The insulating layer 84 is a non-contact drive signal (TLD) film structure for responding to the second touch control structure 40 in related display arts. The covering layer 85 is an over coating (OC) layer in related display arts, and is used to protect the film structures covered by it.

Figure 5:
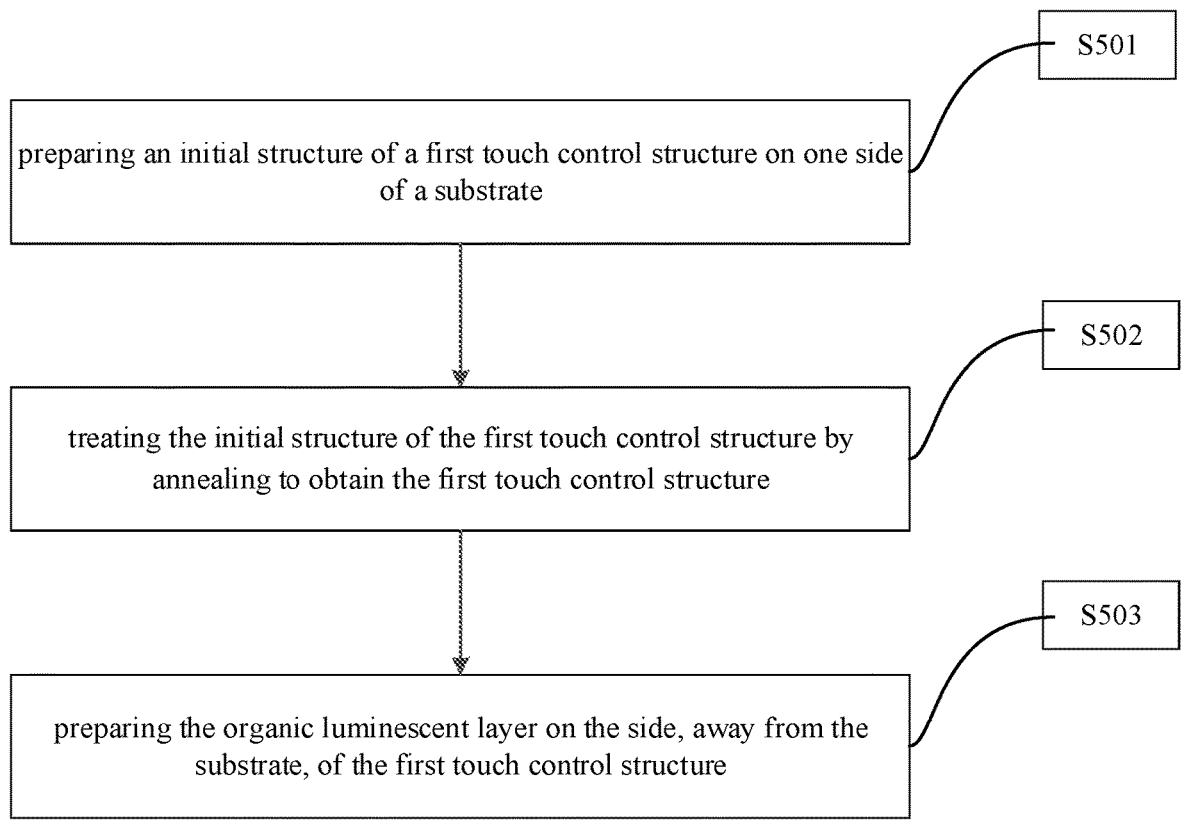
FIG. 5 is a flowchart of a manufacturing method of a display panel provided by an embodiment of the disclosure.

Based on the same inventive concept, an embodiment of the disclosure provides a manufacturing method of a display panel, the flowchart of which is shown in FIG. 5, and the method comprises the following steps:

S501, preparing an initial structure of the first touch control structure on one side of the substrate.

Specifically, the initial structure of the first touch control structure is prepared on one side of the substrate 10 by magnetron sputtering or vacuum evaporation, that is, an ITO thin film layer is formed on one side of the substrate 10.

S502, treating the initial structure of the first touch control structure by annealing to obtain the first touch control structure.

Figure 6:
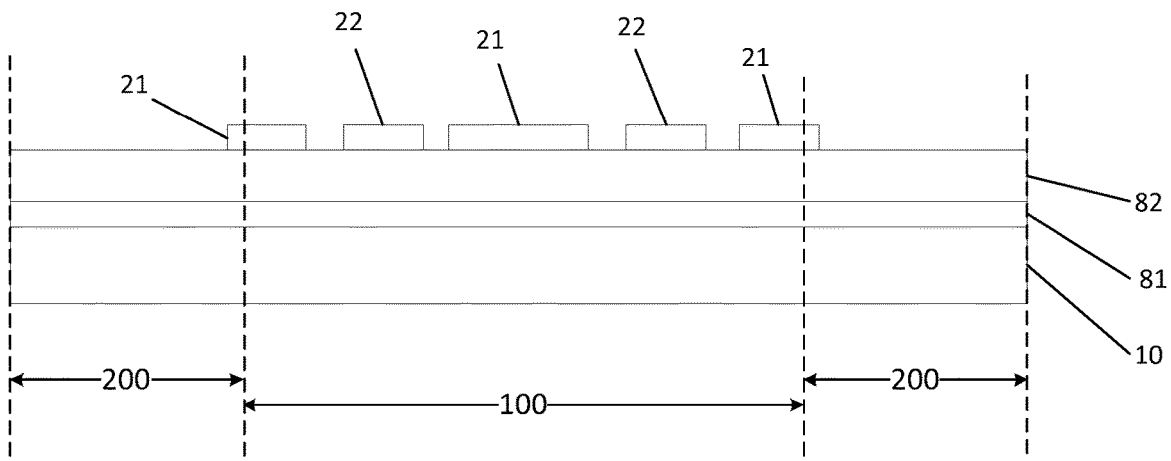
FIG. 6 is a structural diagram of a first intermediate structure of a display panel prepared by a manufacturing method of a display panel provided by an embodiment of the disclosure.

Specifically, the ITO thin film layer is treated by annealing, so that the conductivity and light transmittance of ITO are improved, and the first touch control structure 20 made of ITO is obtained, thereby obtaining a first intermediate structure of the display panel as shown in FIG. 6. It should be noted that in order to ensure the high transmittance and low resistance of ITO, the temperature of the annealing process is usually 250° C.-400° C., and in the embodiment of the disclosure, the temperature of the annealing process is greater than or equal to 300° C.

S503, preparing the organic luminescent layer on the side, away from the substrate, of the first touch control structure.

Specifically, in the first intermediate structure of the display panel shown in FIG. 6, the organic luminescent layer 30 is prepared by vacuum evaporation on the side, away from the substrate 10, of the first touch control structure 20.

In one embodiment of the disclosure, before the above step S503, the pixel defining structure 60 is prepared on one side of the first touch control structure 20 such that the pixel defining structure 60 covers the first wires 21 and the second wires 22 of the first touch control structure 20, and the pixel defining structure 60 is at least partially filled between the first wires 21 and the second wires 22 in the direction parallel to the substrate 10.

In the embodiment of the disclosure, in the first intermediate structure of the display panel shown in FIG. 6, the pixel defining structure 60 is prepared on the side, away from the substrate 10, of the first touch control structure 20 such that the pixel defining structure 60 covers the first wires 21 and the second wires 22 of the first touch control structure 20, and the pixel defining structure 60 is at least partially filled between the first wires 21 and the second wires 22 in the direction parallel to the substrate 10.

In the embodiment of the disclosure, the first wires 21 and the second wires 22 are protected by the pixel defining structure 60; meanwhile, part of the pixel defining structure 60 is used as the dielectric layer located at the first wires 21 and the second wires 22 in the first touch control structure 20, which simplifies the structure and production process of the display panel, thus being beneficial to improving the production efficiency of the display panel and reducing the production cost of the display panel.

In one embodiment of the disclosure, after the above step S503, the method further comprises:

preparing the thin film encapsulation layer 50 on the side, away from the substrate 10, of the organic luminescent layer 30.

Optionally, in the first intermediate structure of the display panel shown in FIG. 6, after the pixel defining structure 60, the organic luminescent layer 30 and the thin film encapsulation layer 50 are sequentially prepared on the side, away from the substrate 10, of the first touch control structure 20, the isolating layer 83 is further prepared on one side of the thin film encapsulation layer 50.

The thin film encapsulation layer 50, the organic luminescent layer 30 and the pixel defining structure 60 are patterned so that at least part of the first wires 21 or the second wires 22 are exposed.

Figure 7:
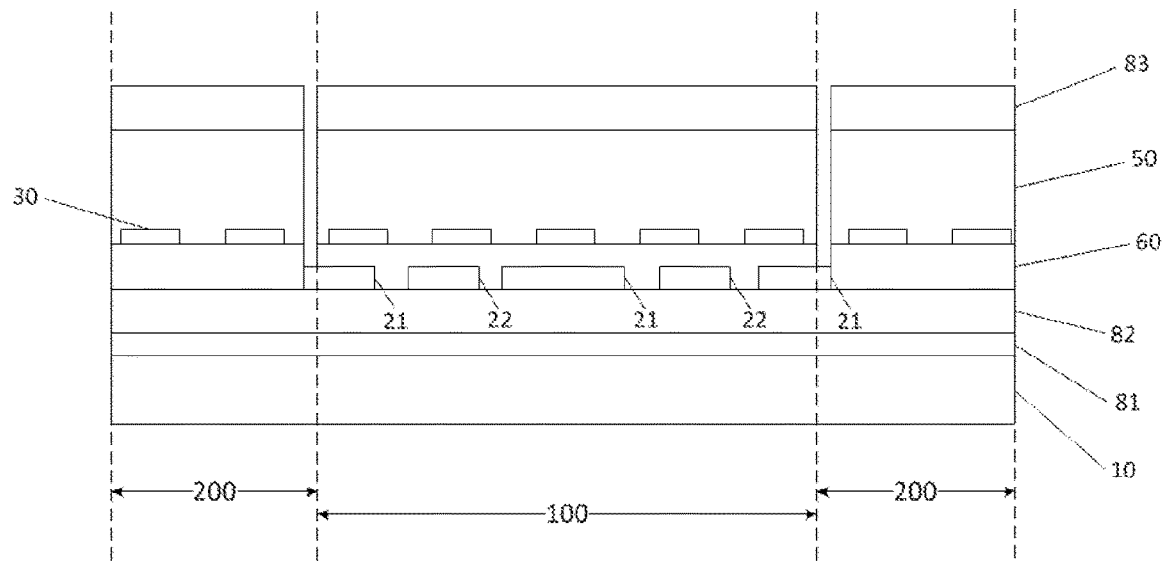
FIG. 7 is a structural diagram of a second intermediate structure of a display panel prepared by a manufacturing method of a display panel provided by an embodiment of the disclosure.

Optionally, the thin film encapsulation layer 50, the isolating layer 83, the organic luminescent layer 30 and the pixel defining structure 60 are patterned to obtain the second intermediate structure of the display panel as shown in FIG. 7, and in the second intermediate structure of the display panel, the second wires 22 near a boundary of the camera area 100 in the first touch control structure 20 are partially exposed. In the embodiment of the disclosure, in order to ensure the stability of the connection between the second wires 22 and the jumper wires 70 and increase the contact area between the second wires 22 and the jumper wires 70, the second wires 22 partially extend to the peripheral area 200 in the direction from the camera area 100 to the peripheral area 200, so that the second wires 22 are at least partially located in the peripheral area 200 of the display panel.

The second touch control structure 40 is prepared on the side, away from the substrate 10, of the thin film encapsulation layer 50, and the second touch control structure 40 is electrically connected with the first wires 21 or the second wires 22.

In the second intermediate structure of the display panel as shown in FIG. 7, the jumper wires 70 are prepared at opening positions such that one ends of the jumper wires 70 are connected with the second wires 22, then the second touch wires 42 are prepared such that the second touch wires 42 are connected with the other ends of the jumper wires 70, then the insulating layer 84 and the first touch wires 41 are sequentially prepared to obtain the second touch control structure 40, and the covering layer 85 is prepared on one side of the first touch wires 41 and the insulating layer 84, so as to obtain the display panel as shown in FIG. 4.

In one embodiment of the disclosure, preparing the initial structure of the first touch control structure on one side of the substrate 10 specifically comprises:

preparing the display device film layer 81 on one side of the substrate 10;

preparing the planarization layer 82 on the side, away from the substrate 10, of the display device film layer 81; and preparing the initial structure of the first touch control structure on one side of the planarization layer 82.

Based on the same inventive concept, an embodiment of the disclosure provides display equipment, which comprises the display panel as provided in the above embodiments.

Figure 8:
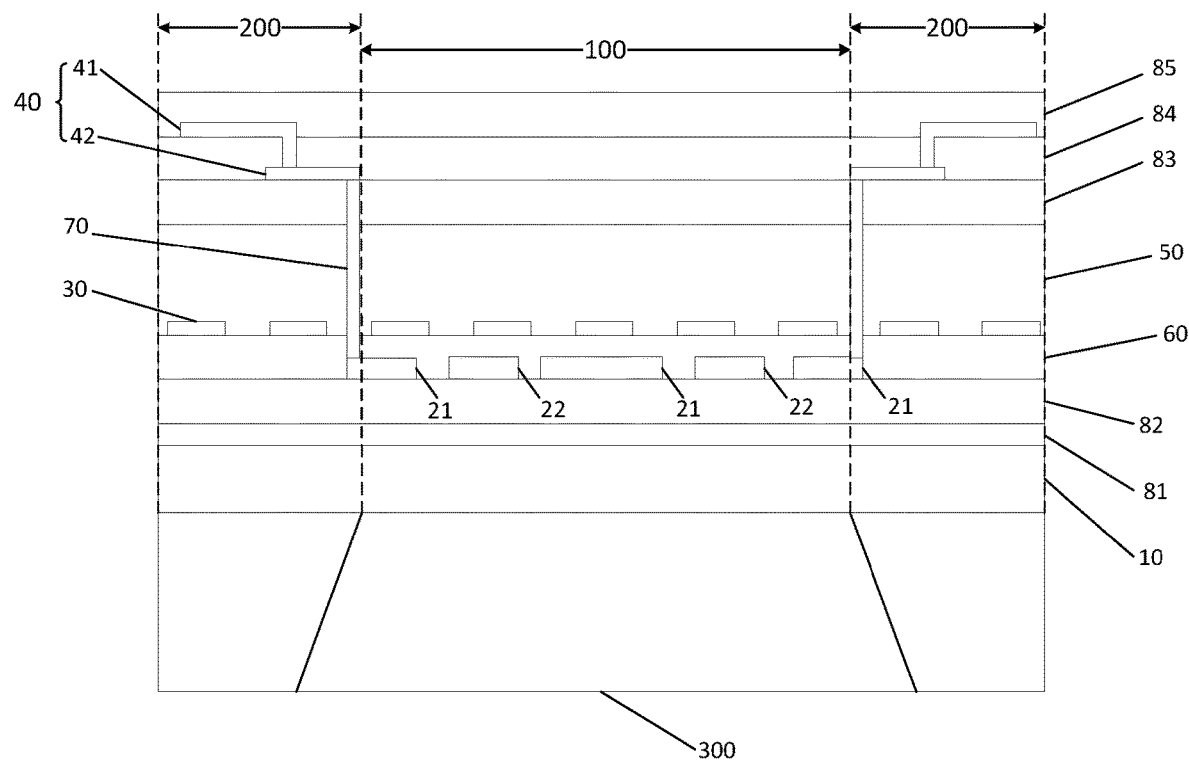
FIG. 8 is a structural diagram of display equipment provided by an embodiment of the disclosure.

As shown in FIG. 8 which is a structural diagram of the display equipment provided by the embodiment of the disclosure, a camera component 300 of the display equipment corresponds to the camera area 100 of the display panel.

The embodiments of the disclosure can at least achieve the following beneficial effects:

in the display panel provided by the embodiments of the disclosure, since the transparent first touch control structure 20 is provided in the camera area 100 of the display area, the camera area 100 of the display panel has a touch control function; further, the first touch control structure 20 is located between the substrate 10 and the organic luminescent layer 30, that is, the preparation of the first touch control structure 20 takes place before the preparation of the organic luminescent layer 30, thus effectively avoiding the influence of a process for preparing the first touch control structure 20 on the organic luminescent layer 30 while ensuring the conductivity of the first touch control structure 20, so that the camera area 100 of the display panel provided by the embodiment of the disclosure can realize the display and touch control functions, and the light transmittance of the camera area 100 and the image pickup effect of the camera area 100 are guaranteed.

In the description of the disclosure, it should be noted that the orientation or position relationship indicated by the terms "centric", "upper", "lower", "front", "rear", "left", "right", "vertical", "horizontal", "top", "bottom", "inner" and "outer" are based on the orientation or position relationship shown in the drawings, only for convenience of describing the disclosure and simplifying the description, and do not indicate or imply that the indicated device or element must have a specific orientation, or be constructed and operate in a specific orientation, and therefore cannot be understood as a limitation of the disclosure.

The terms "first" and "second" are only used for descriptive purposes, and cannot be understood as indicating or implying relative importance or implicitly indicating the number of indicated technical features. Therefore, the features defined with "first" and "second" may include one or more of the features explicitly or implicitly. In the description of the disclosure, unless otherwise specified, the meaning of "a plurality of" is two or more.

In the description of this specification, the specific features, structures, materials or characteristics described may be combined in any one or more embodiments or examples in a suitable manner.

The above are only part of the embodiments of the disclosure, and it should be pointed out that, for those of ordinary skill in the art, without departing from the principle of the disclosure, several improvements and embellishments can be made, and these improvements and embellishments should also be considered within the scope of protection of the disclosure.

The invention claimed is:

1. A display panel, comprising a display area, wherein the display area comprises a camera area and a peripheral area surrounding the camera area,
   the camera area is provided with a transparent first touch control structure, and the first touch control structure is arranged between a substrate and an organic luminescent layer in a direction perpendicular to the substrate;
   wherein the peripheral area is provided with a second touch control structure, and the second touch control structure is located on the side, away from the organic luminescent layer, of a thin film encapsulation layer and is electrically connected with the first touch control structure;
   wherein the first touch control structure comprises a plurality of first wires and a plurality of second wires, the first wires and the second wires are insulated from each other, and the first wires are electrically connected with the second touch control structure, or the second wires are electrically connected with the second touch control structure;

wherein jumper wires are further provided, one end of a jumper wire is electrically connected with the second touch control structure, and the other end of the jumper wire is electrically connected with the first wires or the second wires.

2. The display panel according to claim 1, wherein a first wire and a second wire each comprise a plurality of electrode blocks, and in a direction parallel to the substrate, the shapes of the electrode blocks include at least one of the following: square and rhombus.

3. The display panel according to claim 2, wherein a first wire comprises a bridging wire, one end of the bridging wire is connected with one electrode block of the first wire, and the other end of the bridging wire is connected with another electrode block of an adjacent first wire; or a second wire comprises a bridging wire, one end of the bridging wire is connected with one electrode block of the second wire, and the other end of the bridging wire is connected with another electrode block of an adjacent second wire;

and the electrode blocks of the first wires and the electrode blocks of the second wires are arranged on the same layer.

4. The display panel according to claim 1, wherein a pixel defining structure is disposed between the organic luminescent layer and the first touch control structure, and the pixel defining structure covers the first wires and the second wires;

and in a direction parallel to the substrate, the pixel defining structure is at least partially filled between the first wires and the second wires.

5. The display panel according to claim 1, wherein the second touch control structure comprises first touch wires and second touch wires, and the first touch wires and the second touch wires are arranged along the areas between sub-pixels of the organic luminescent layer in a direction perpendicular to the substrate.

6. The display panel according to claim 5, wherein under the condition that the first wires are transmitting electrodes of the first touch control structure and the first touch wires are transmitting electrodes of the second touch control structure, the first wires are electrically connected with the first touch wires.

7. The display panel according to claim 1, wherein a planarization layer is disposed between the substrate and the organic luminescent layer, and the first touch control structure is located on the side, away from the substrate, of the planarization layer.

8. A display equipment, comprising the display panel according to claim 1.

* * * * *